US012733461B2

(12) United States Patent
Nakabayashi et al.

(10) Patent No.: US 12,733,461 B2
(45) Date of Patent: Sep. 8, 2026

(54) SEMICONDUCTOR WAFER PROCESSING APPARATUS AND METHOD OF MANUFACTURING SEMICONDUCTOR ELEMENT

(71) Applicants: DENSO CORPORATION, Kariya-city (JP); TOYOTA JIDOSHA KABUSHIKI KAISHA, Toyota (JP); MIRISE Technologies Corporation, Nisshin (JP); National University Corporation Tokai National Higher Education and Research System, Nagoya (JP); HAMAMATSU PHOTONICS K.K., Hamamatsu (JP)

(72) Inventors: Shosuke Nakabayashi, Nisshin (JP); Junji Ohara, Nisshin (JP); Masatake Nagaya, Nisshin (JP); Chiaki Sasaoka, Nagoya (JP); Shoichi Onda, Nagoya (JP); Jun Kojima, Nagoya (JP); Daisuke Kawaguchi, Hamamatsu (JP); Ryuji Sugiura, Hamamatsu (JP); Toshiki Yui, Hamamatsu (JP); Keisuke Hara, Hamamatsu (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP); National University Corporation Tokai National Higher Education and Research System, Nagoya (JP); HAMAMATSU PHOTONICS K.K., Hamamatsu (JP)

( * ) Notice: Subject to any disclaimer, the term of this patent is extended or adjusted under 35 U.S.C. 154(b) by 750 days.

(21) Appl. No.: 18/147,764

(22) Filed: Dec. 29, 2022

(65) Prior Publication Data

US 2023/0230829 A1 Jul. 20, 2023

(30) Foreign Application Priority Data

Jan. 18, 2022 (JP) ................................ 2022-005951

(51) Int. Cl.
*H10P 90/00* (2026.01)

(52) U.S. Cl.
CPC .................................. *H10P 90/12* (2026.01)

(58) Field of Classification Search
CPC ............................ H01L 21/0201; H10P 90/12
See application file for complete search history.

(56) References Cited

U.S. PATENT DOCUMENTS

2004/0214408 A1* 10/2004 Wakayama ........... H01L 23/544 438/462
2009/0142906 A1* 6/2009 Nakamura ........ H01L 21/67132 257/E21.214

(Continued)

FOREIGN PATENT DOCUMENTS

| | | | | |
|---|---|---|---|---|
| JP | 2000269164 | A | * | 9/2000 |
| JP | 2020-102520 | A | | 7/2020 |
| WO | 2019/044588 | A1 | | 3/2019 |

*Primary Examiner* — Jeff W Natalini
*Assistant Examiner* — Ian Isaac Degrasse
(74) *Attorney, Agent, or Firm* — Posz Law Group, PLC

(57) ABSTRACT

A method of manufacturing a semiconductor element includes formation of a modified layer, detection of a first region, and cutting of a semiconductor wafer. In the formation of the modified layer, a laser is irradiated on the semiconductor wafer to form the modified layer extending along a surface of the semiconductor wafer inside the semiconductor wafer. The surface of the semiconductor wafer includes a peripheral portion having the first region and a second region. The first region is a region in which the modified layer is not located, and the second region is a region in which the modified layer is formed. In the cutting (Continued)

of the semiconductor wafer, the semiconductor wafer is cut at the modified layer starting from the second region.

13 Claims, 13 Drawing Sheets

(56) References Cited

U.S. PATENT DOCUMENTS

| | | | | |
|---|---|---|---|---|
| 2018/0254223 | A1 | 9/2018 | Hirata et al. | |
| 2019/0224784 | A1 | 7/2019 | Fujiwara et al. | |
| 2020/0135566 | A1* | 4/2020 | Aketa | H01L 21/304 |
| 2021/0057222 | A1* | 2/2021 | Sakamoto | H01L 25/50 |
| 2021/0066129 | A1* | 3/2021 | Miyata | H10P 54/00 |
| 2021/0327744 | A1* | 10/2021 | Nakamura | H01L 21/78 |

* cited by examiner

SEMICONDUCTOR WAFER PROCESSING APPARATUS AND METHOD OF MANUFACTURING SEMICONDUCTOR ELEMENT

CROSS REFERENCE TO RELATED APPLICATION

This application is based on Japanese Patent Application No. 2022-005951 filed on Jan. 18, 2022, the disclosure of which is incorporated herein by reference.

TECHNICAL FIELD

The present disclosure relates to a semiconductor wafer processing apparatus and a method of manufacturing a semiconductor element.

BACKGROUND

A slim semiconductor wafer may be acquired by cutting a semiconductor wafer along the surface of the semiconductor wafer. In this manufacturing method, a laser may be irradiated on the semiconductor wafer to form a modified layer extending along the surface inside the semiconductor wafer. In the modified layer, the strength of the semiconductor wafer may decrease. Subsequently, by applying a force to an upper surface of the semiconductor wafer in a direction from a lower surface of the semiconductor wafer, the semiconductor wafer may be cut at the modified layer. In a process of cutting the semiconductor wafer, the semiconductor may be cut starting from a peripheral portion of the semiconductor wafer. In other words, the semiconductor wafer may be cut by a crack, that is, a cutting plane generated at the peripheral portion of the semiconductor wafer as a starting point.

SUMMARY

The present disclosure describes a semiconductor wafer processing apparatus including a detector, a position adjuster and a cutter, and further describes a method of manufacturing a semiconductor element including formation of a modified layer and cutting of a semiconductor wafer.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
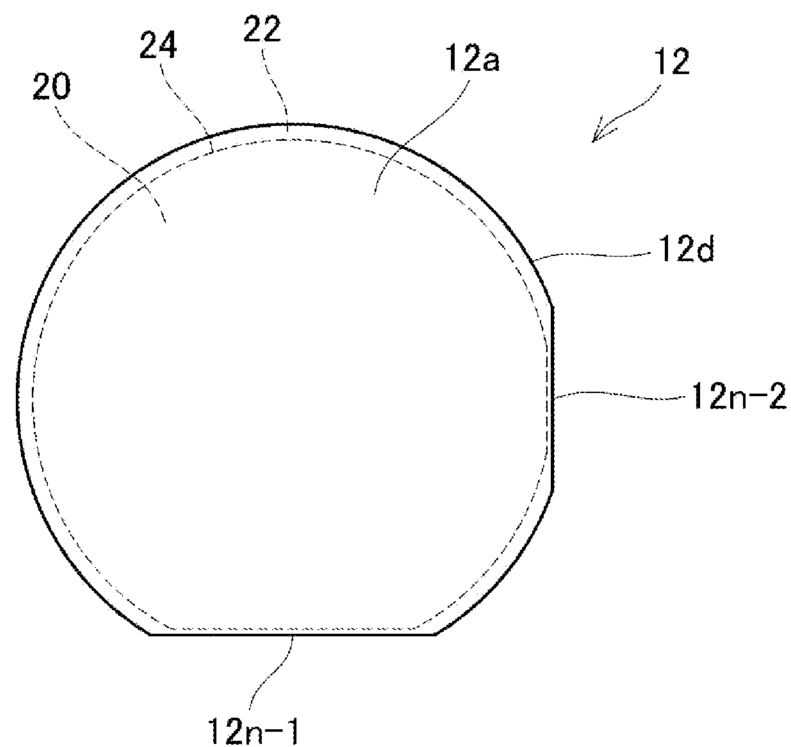
FIG. 1 is a plan view of a semiconductor wafer.

In a process of irradiating a laser on a semiconductor wafer, a modified layer may not be formed in an entire target region of the semiconductor wafer. For example, the modified layer may not be formed at a portion of the target due to an equipment fault of a laser irradiation device. Additionally, when the laser is blocked by foreign matter existing on the surface of the semiconductor wafer, the modified layer may not be formed at a portion of the target region. A region where the modified layer is not formed is also referred to as a modified layer unformed region. In a case where the modified layer unformed region is present, the semiconductor wafer may not be properly cut in the modified layer unformed region. Moreover, in a case where the modified layer unformed region is present at the starting point of the cutting process, the semiconductor wafer may not be properly cut at a region (in other words, a region where the modified layer is present) adjacent to the modified layer unformed region.

According to a first aspect of the present disclosure, a method of manufacturing a semiconductor element includes formation of a modified layer, detection of a first region and cutting of a semiconductor wafer. In the formation of the modified layer, a laser is irradiated on the semiconductor wafer to form the modified layer extending along a surface of a semiconductor wafer inside the semiconductor wafer. The surface of the semiconductor wafer includes a peripheral portion having the first region and a second region. The first region is a region in which the modified layer is not formed, and the second region is different from the first region and is a region in which the modified layer is formed.

In the cutting of the semiconductor wafer, the semiconductor wafer is cut at the modified layer starting from the second region.

The peripheral portion of the surface of the semiconductor wafer may also be referred to as an edge portion of the flat surface of the semiconductor wafer on the outer peripheral side. Therefore, a bevel section near the side surface of the semiconductor wafer is not included in the peripheral portion of the surface of the semiconductor wafer.

In the method described above, the semiconductor wafer is cut at the modified layer in the second region as the starting point. In a case where the first region of the peripheral portion is located at a position different from the starting point of the cutting, it is possible to inhibit a situation in which the semiconductor wafer cannot be properly cut in a region adjacent to the first region. Therefore, according to the method described above, it is possible to properly cut the semiconductor wafer in a relatively wide region.

According to a second aspect of the present disclosure, a semiconductor wafer processing apparatus for processing a semiconductor wafer includes a detector, a position adjuster and a cutter. The semiconductor wafer includes a modified layer extending along a surface of the semiconductor wafer inside the semiconductor wafer. The surface of the semiconductor wafer includes a peripheral portion having a first region and a second region. The first region is a region in which the modified layer is absent, and the second region is different from the first region and is a region in which the modified layer is present. The detector detects the first region. The position adjuster disposes the semiconductor wafer at the cutter while locating the second region at a cut starting point of the cutter. The cutter cuts the semiconductor wafer at the modified layer starting from the cut starting point.

According to the semiconductor wafer processing apparatus described above, it is possible to properly cut the semiconductor wafer in a relatively wide region.

In the method described above, the semiconductor wafer may be made of a group III-V semiconductor or gallium oxide.

According to this structure, since the semiconductor wafer is transparent to light, the first region may be easily detected.

In the method described above, before the process of cutting the semiconductor wafer, a separation line may be specified at the surface of the semiconductor wafer. The separation line passes through the center of the outer circle of the semiconductor wafer while extending in a specific crystal orientation.

According to this structure, regardless of whether the first end portion or the second end portion is the starting point, a crack in the cutting process may progress along the separation line. Therefore, a flat cutting plane may be acquired when the crack progresses in the specific crystal orientation.

In the cutting process included in the method described above, in a situation where both of the first end portion and the second end portion of the separation line is present at the first region, the semiconductor wafer may be cut at the modified layer starting from an end portion of a line on the surface of the semiconductor wafer. The line passes through the center of the outer circle of the semiconductor wafer while extending in a direction different from the specific crystal orientation.

According to this structure, even in a situation where both of the first end portion and the second end portion are present at the first region, the semiconductor wafer may be cut starting from a region in which the modified layer is located.

In the semiconductor wafer processing apparatus described above, the position adjuster may specify the separation line extending in the specific crystal orientation while passing through the center of the outer circle of the semiconductor wafer on the surface of the semiconductor wafer. The separation line has a first end portion and a second end portion on a side opposite from the first end portion. The position adjuster may dispose the semiconductor wafer at the cutter while locating the first end portion at a cut starting point based on a condition that the first end portion of the separation line is absent from the first region. The position adjuster may dispose the semiconductor wafer at the cutter while locating the second end portion at the cut starting point based on a condition that the first end portion of the separation line is present at the first region.

In the semiconductor wafer processing apparatus described above, the position adjuster may dispose the semiconductor wafer at the cutter while locating an end portion of a line at the cut starting point, based on a condition that both of the first end portion and the second end portion of the separation line are present at the first region. The line is located on the surface of the semiconductor wafer, and extends in a direction different from the crystal orientation while passing through the center of the outer circle of the semiconductor wafer.

Figure 2:
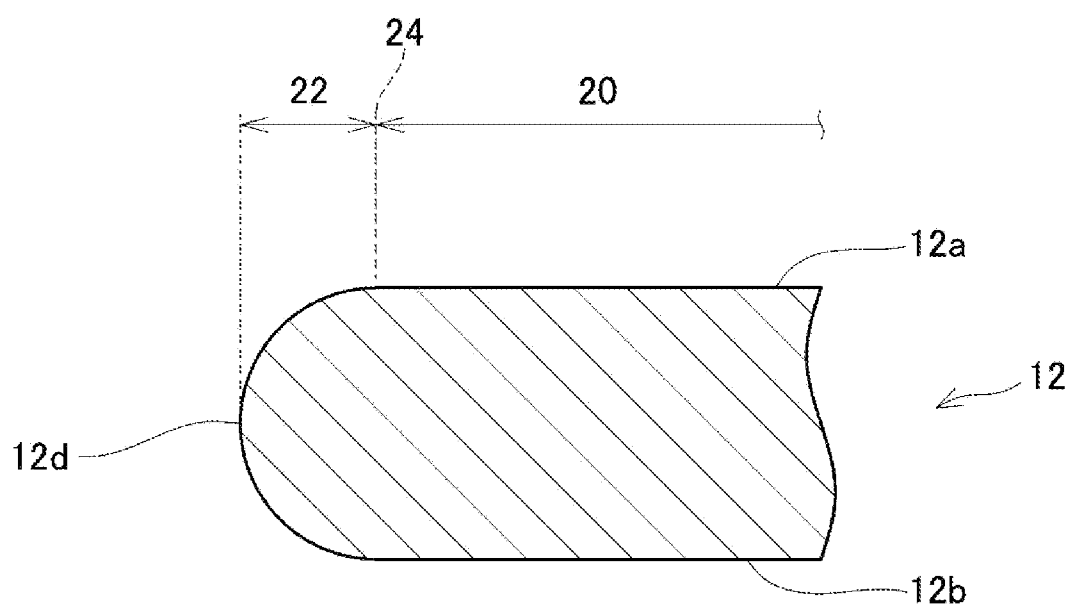
FIG. 2 is a cross-sectional view of a portion of the semiconductor wafer in the vicinity of the side surface of the semiconductor wafer.

The following describes a manufacturing method of a semiconductor element in the present embodiment in comparison to a manufacturing method of a semiconductor element in a comparative example. FIG. 1 illustrates a semiconductor wafer 12 to be processed. The semiconductor wafer 12 is made of a single crystal of gallium nitride. The semiconductor wafer 12 is transparent to light. An upper surface 12*a* of the semiconductor wafer 12 is made of a specific crystal plane, for example, an m-plane. A side surface 12*d* of the semiconductor wafer 12 is provided with two orientation flats 12*n*-1, 12*n*-2 respectively indicating specific crystal orientations. FIG. 2 illustrates a cross-sectional view of a portion of the semiconductor wafer 12 in the vicinity of the side surface 12*d*. A bevel section 22 having a tilted surface is provided in the vicinity of the side surface 12*d*. The surface of the bevel section 22 is tilted such that the thickness of the semiconductor wafer 12 becomes smaller as approaching to the side surface 12*d*. A main section 20 illustrated in FIG. 2 is a portion having the flat upper surface 12*a*. A boundary between the main section 20 and the bevel section 22 is a peripheral portion 24 of the upper surface 12*a*.

In both of a manufacturing method according to the present embodiment and a manufacturing method according to a comparative example, a laser irradiating process and a semiconductor wafer cutting process are executed in order for the semiconductor wafer 12. A semiconductor element structure or a portion of the semiconductor element structure may be formed before executing the laser irradiating process.

Figure 3:
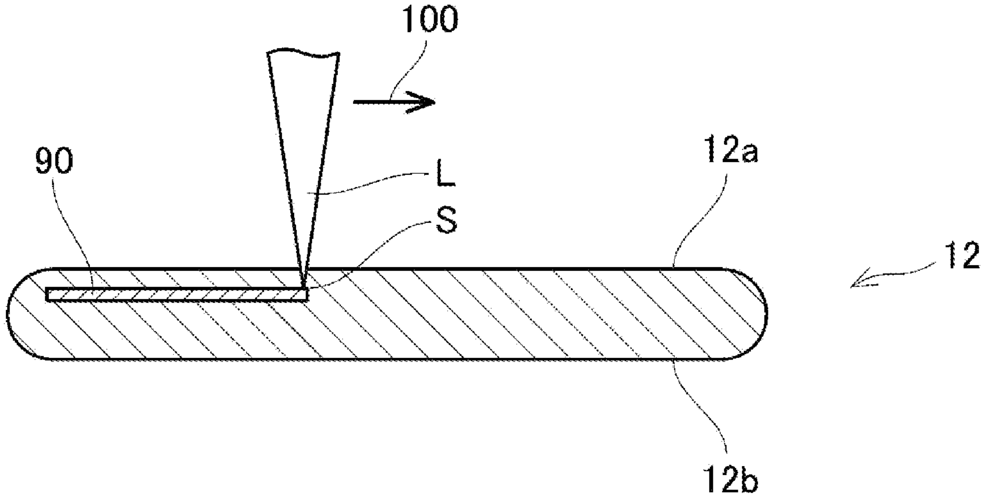
FIG. 3 is a cross-sectional view of a laser irradiating process.
Figure 4:
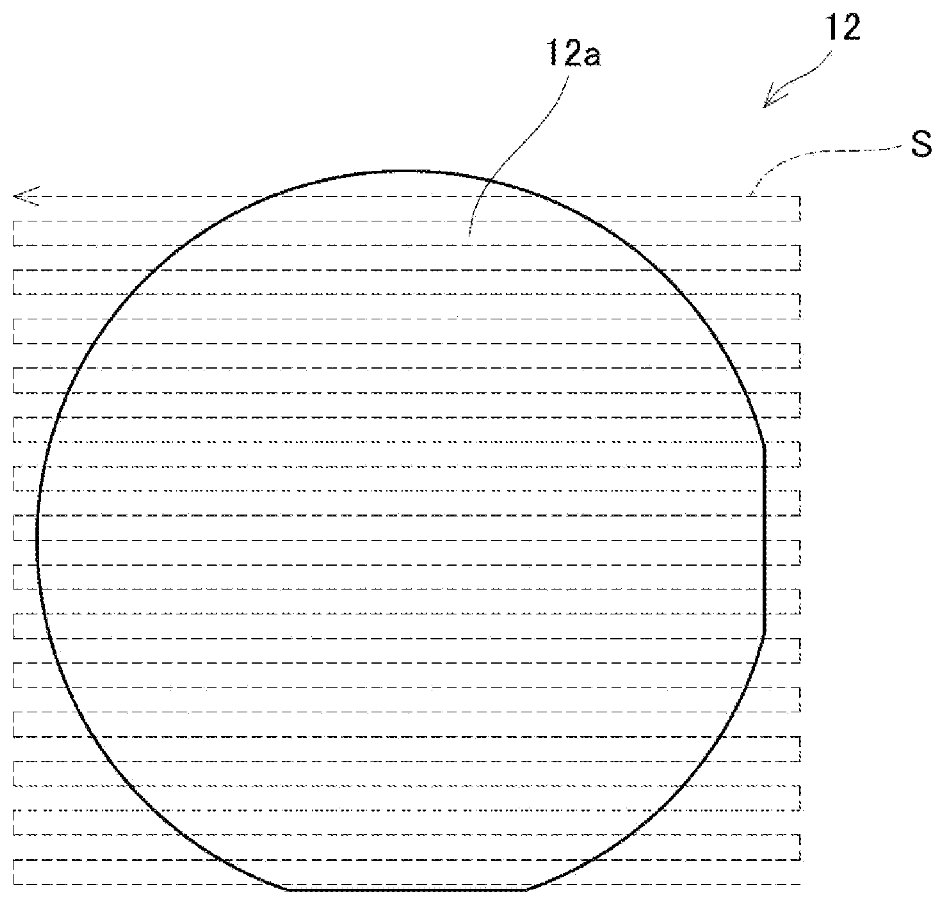
FIG. 4 is a plan view of the laser irradiating process.

The laser irradiating process in both of the manufacturing method according to the present embodiment and the manufacturing method according to the comparative example is common. In the laser irradiating process, as illustrated in FIG. 3, a laser L is irradiated on the semiconductor wafer 12 while a focal point S is formed inside the semiconductor wafer 12. Although FIG. 3 illustrates that the laser L is irradiated on the semiconductor wafer 12 from the upper surface 12*a* side, the laser L may be irradiated on the semiconductor wafer 12 from a lower surface 12*b* side. At the position of the focal point S, a modified layer 90 is formed by heating and decomposing the semiconductor wafer 12. In other words, the modified layer 90 is a crystal defect layer, and is a layer made of, for example, gallium acquired by deposition of gallium nitride. The focal point S is moved in a direction parallel to the upper surface 12*a* of the semiconductor wafer 12 as indicated by an arrow 100. As a result, the modified layer 90 extending in a direction parallel to the upper surface 12*a* is formed inside the semiconductor wafer 12. As illustrated by a dashed-line arrow in FIG. 4, the modified layer 90 is formed on a substantially entire region of the semiconductor wafer in a lateral direction by moving the focal point S while scanning the entire semiconductor wafer 12. In the modified layer 90, the strength of the semiconductor wafer 12 is lower than a portion of the semiconductor wafer 12 without the modified layer 90, in other words, a crystalline region.

In the laser irradiating process, the laser L may be reflected or refracted by the surface of the bevel section 22 so that the modified layer 90 may not be formed inside the bevel section 22. In the laser irradiating process, the modified layer 90 is formed on the entire region of the main section 20 in the lateral direction. However, the modified layer 90 may not be formed in a portion of the main section 20 due to a fault occurred in the laser irradiating process. For example, the modified layer 90 may not be formed in a portion of the main section 20 due to an equipment fault of a laser irradiation device. Additionally, the modified layer 90 may not be formed in a portion of the main section 20 when the laser L is shielded by foreign substance adhered to the semiconductor wafer 12. In a top view of the semiconductor wafer 12, a region where the modified layer 90 is formed may be referred to as a modified layer formed region 92 in the following; and a region where the modified layer 90 is not formed may be referred to as a modified layer unformed region 94 in the following. The modified layer formed region 92 corresponds to a second region, and the modified layer unformed region 94 corresponds to a first region.

(Semiconductor Wafer Cutting Process in Comparative Example)

The following describes a semiconductor wafer cutting process in a comparative example. The semiconductor wafer cutting process is executed by adopting a cutting mechanism 50 illustrated in FIGS. 5, 6. The cutting mechanism 50 corresponds to a cutter. The cutting mechanism 50 includes a stage 52 and a rotary plate 54. The rotary plate 54 can rotate around a rotary shaft 56. The rotary plate 54 is rotated by a motor (not shown). The cutting mechanism 50 is opened and closed by rotating the rotary plate 54. In the semiconductor wafer cutting process according to the comparative example, the semiconductor wafer 12 is placed on the stage 52 in a state where the cutting mechanism 50 is opened. The lower surface 12*b* of the semiconductor wafer 12 is fixed to the stage 52. For example, the lower surface 12*b* can be fixed to the stage 52 by vacuum absorption. The lower surface 12*b* may be fixed to the stage 52 with, for example, an adhesive tape or an adhesive agent. Subsequently, the rotary plate 54 is rotated to close the cutting mechanism 50, and the lower surface of the rotary plate 54 is fixed to the upper surface 12*a* of the semiconductor wafer 12. For example, the upper surface 12*a* can be fixed to the rotary plate 54 by vacuum absorption. The upper surface 12*a* may be fixed to the rotary plate 54 with, for example, an adhesive tape or an adhesive agent. Subsequently, as illustrated in FIG. 6, the rotary plate 54 is rotated to open the cutting mechanism 50. An upper portion 12U of the semiconductor wafer 12 is pulled away from a lower portion 12L of the semiconductor wafer 12. As a result, a crack occurs at the modified layer 90, and the semiconductor wafer 12 is split. In other words, the upper portion 12U is separated from the lower portion 12L. As a result, the upper portion 12U with a smaller thickness can be acquired.

(Difficulties in Semiconductor Wafer Cutting Process According to Comparative Example)

Figure 7:
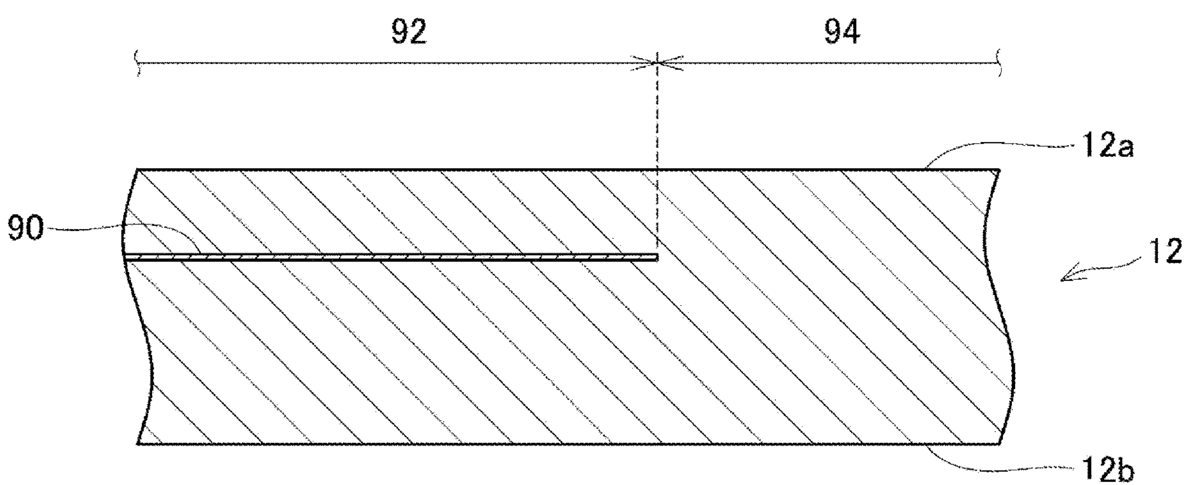
FIG. 7 is a cross-sectional view of each of a modified layer formed region and a modified layer unformed region.
Figure 8:
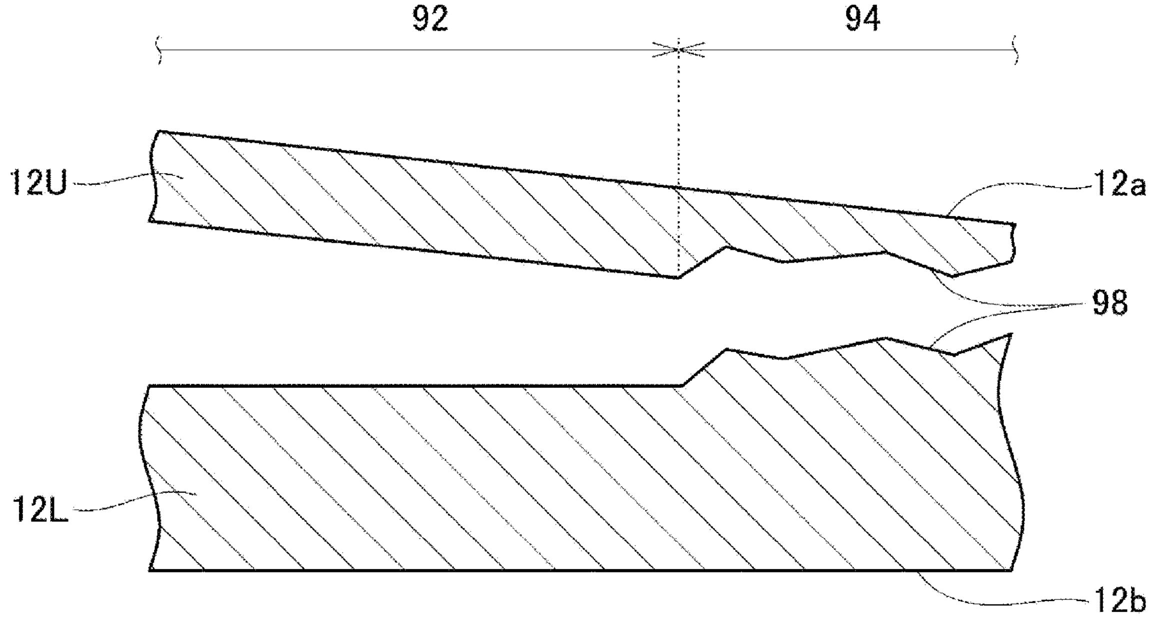
FIG. 8 is a cross-sectional view of each of the modified layer formed region and the modified layer unformed region after being cut.

As illustrated in FIG. 7, the modified layer 90 does not exist in the modified layer unformed region 94. Therefore, it is not possible to cut the semiconductor wafer 12 in an intended shape inside the modified layer unformed region 94. For example, as illustrated in FIG. 8, the crack is formed at a location away from the depth of the modified layer 90 inside the modified layer unformed region 94. FIG. 8 illustrates that the thickness of the upper portion 12U in the modified layer unformed region 94 is smaller than the thickness of the upper portion 12U in the modified layer formed region 92. Additionally, the thickness of the upper portion 12U in the modified layer unformed region 94 may be larger than the thickness of the upper portion 12U in the modified layer formed region 92. Surface roughness with recessions and protrusions may occur at the cutting plane inside the modified layer unformed region 94. In the following, a region where the cutting plane, in other words, the crack is not formed in an intended shape may also be referred to as an unintended cutting portion 98.

Figure 5:
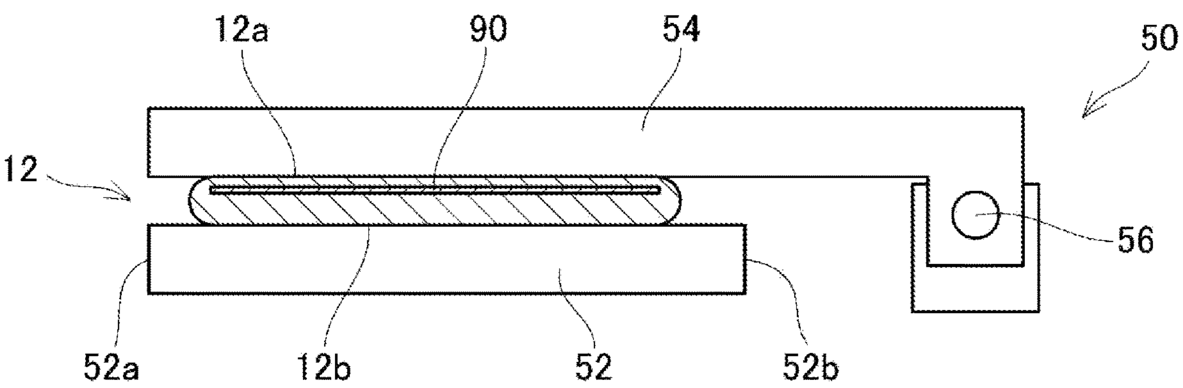
FIG. 5 is a side view of a cutting mechanism in a closed state.
Figure 6:
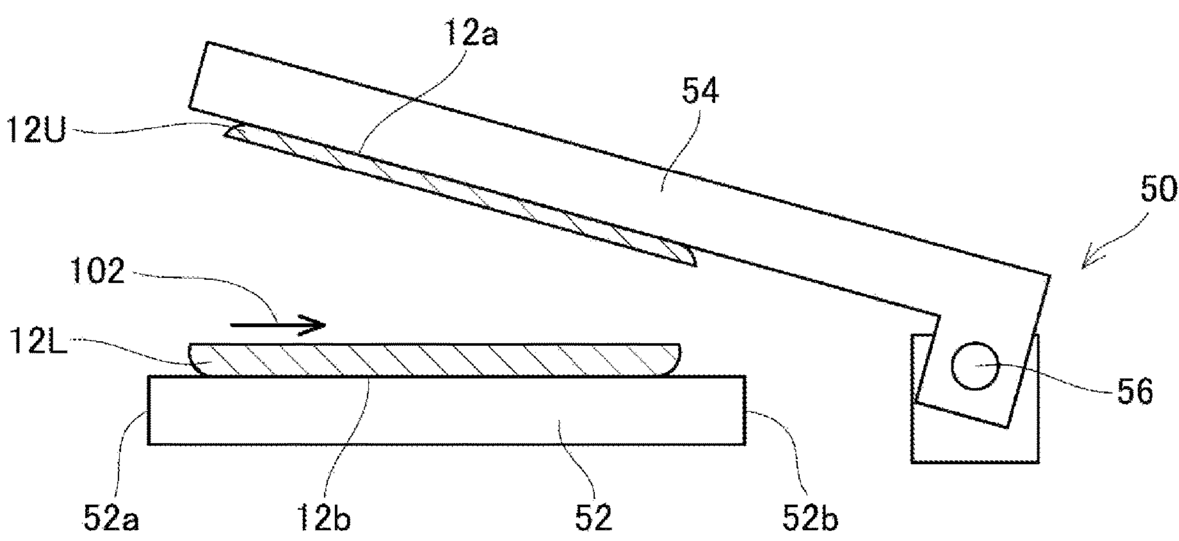
FIG. 6 is a side view of the cutting mechanism in an opened state.
Figure 9:
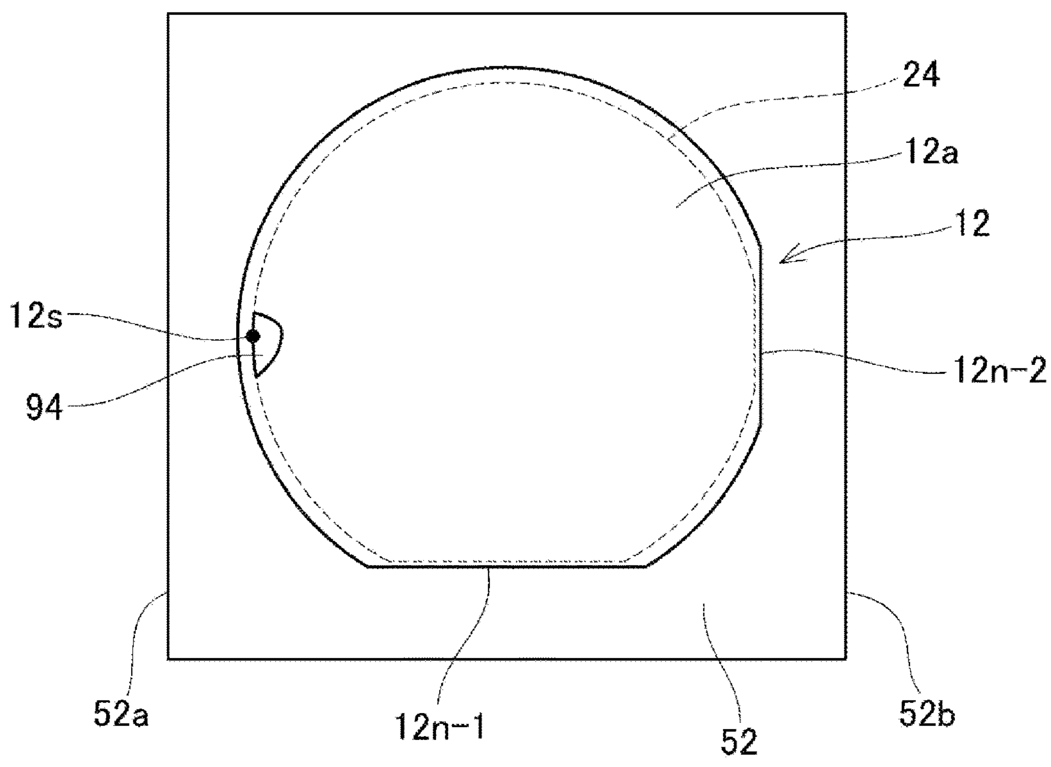
FIG. 9 is a plan view of arrangement of the semiconductor wafer on a stage in a cutting process according to a comparative example.

Each of FIGS. 5 and 6 illustrates that a side surface 52*a* indicates a side surface of the stage 52 farther from the rotary shaft 56, and a side surface 52*b* indicates a side surface of the stage 52 closer to the rotary shaft 56. When the rotary plate 54 is rotated to cut the semiconductor wafer 12, the amount of elevation of the rotary plate 54 is larger in the vicinity of the side surface 52*a* than in the vicinity of the side surface 52*b*. As indicated by an arrow 102 in FIG. 6, the crack progresses in the semiconductor wafer from the side surface 52*a* to the side surface 52*b*. As illustrated in FIG. 9, the location of the peripheral portion 24 of the semiconductor wafer 12 that is closest to the side surface 52*a* becomes a substantial cut starting point 12*s* of the semiconductor wafer 12. That is, the cut starting point 12*s* is on the peripheral portion 24 defined by a positional relationship between the stage 52 and the semiconductor wafer 12. In the semiconductor wafer cutting process according to the comparative example, as illustrated in FIG. 9, the modified layer unformed region 94 may exist at the cut starting point 12*s*. When the semiconductor wafer 12 is cut in a state where the modified layer unformed region 94 exists at the cut starting point 12*s*, a crack does not only occur at the modified layer unformed region 94 but also at a region 96, in other words, the modified layer formed region 92 adjacent to the modified layer unformed region 94 at the side surface 52*b* side. Thus, the unintended cutting portion 98 is generated at the region 96. In other words, in the region 96 where a modified layer 70 exists, the semiconductor wafer 12 is cut at a position away from the modified layer 70. In the semiconductor wafer cutting process according to the comparative example, in a case where the modified layer unformed region 94 exists at the cut starting point 12*s*, it is possible that the semiconductor wafer 12 cannot be properly cut not just only at the modified layer unformed region 94 but also at the region 96 adjacent to the modified layer unformed region 94.

(Manufacturing Method in Present Embodiment)

In the manufacturing method according to the present embodiment, a modified layer unformed region detecting process, a cut starting point calculating process, and an angle adjusting process are executed before a semiconductor wafer cutting process. That is, in the manufacturing method according to the present embodiment, the modified layer unformed region detecting process, the cut starting point calculating process, the angle adjusting process and the semiconductor wafer cutting process are executed in order.

Figure 11:
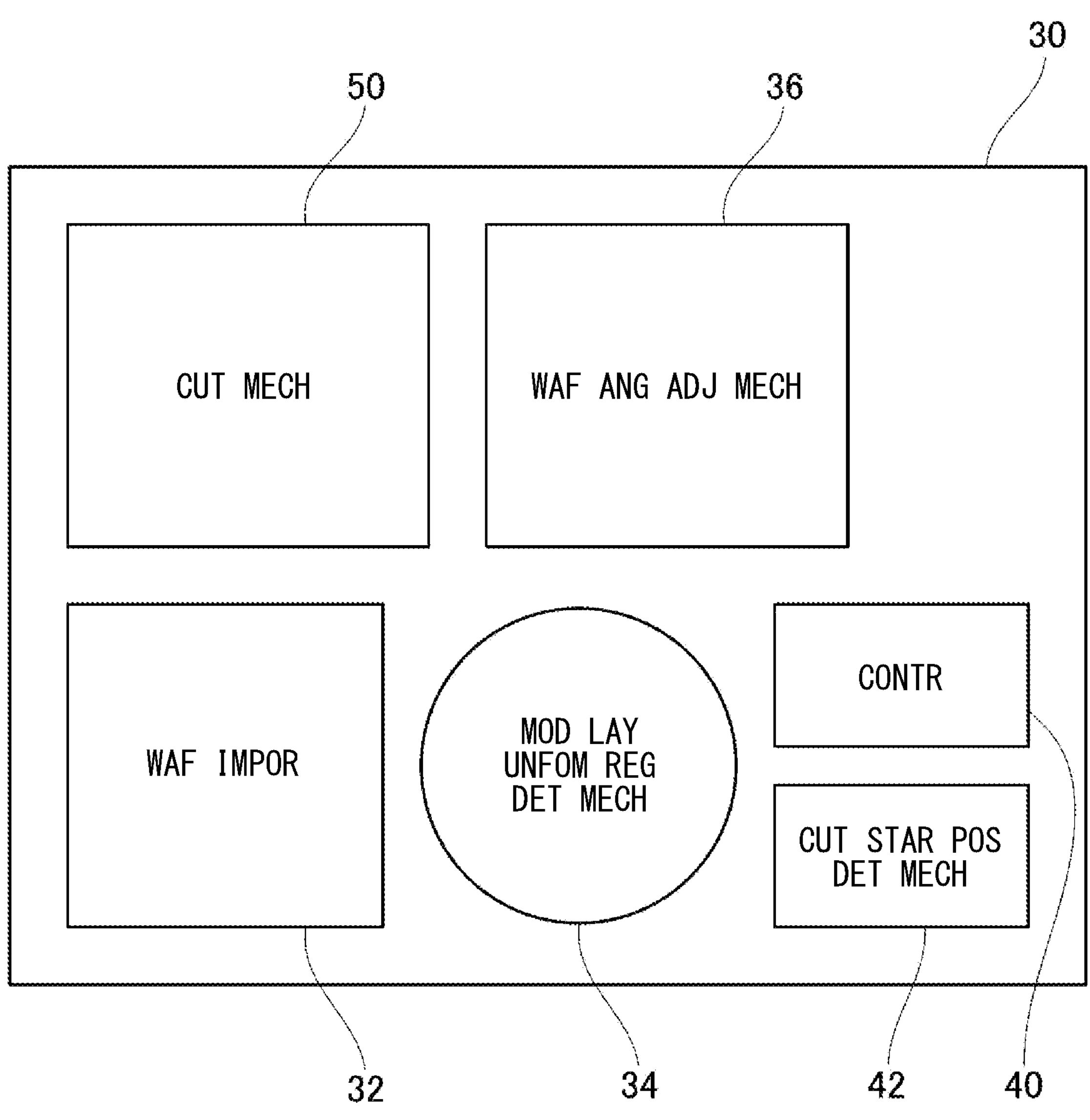
FIG. 11 is a block diagram of a semiconductor wafer processing apparatus.

FIG. 11 indicates a semiconductor wafer processing apparatus 30 for executing the modified layer unformed region detecting process, the cut starting point calculating process, the angle adjusting process and the semiconductor wafer cutting process. The semiconductor wafer processing apparatus 30 includes a wafer importer 32, a modified layer unformed region detection mechanism (MOD LAY UNFOM REG DET MECH) 34, a wafer angle adjustment mechanism (WAF ANG ADJ MECH) 36, a cutting mechanism (CUT MECH) 50, a controller (CONTR) 40 and a cut starting point determination device (CUT STAR POS DET MECH) 42. The cut starting point determination device 42 may also be referred to as a cut starting point determination mechanism. The modified layer unformed region detection mechanism 34 corresponds to a detector. The wafer angle adjustment mechanism 36 corresponds to a wafer angle adjuster. The cutting mechanism 50 corresponds to a cutter. Each of the controller 40 and the cut starting point determination device 42 includes an arithmetic circuit. The cutting mechanism 50 included in the present embodiment is the same as the cutting mechanism 50 illustrated in FIGS. 5, 6. Although not shown, the semiconductor wafer processing apparatus 30 has a transfer mechanism for transferring the semiconductor wafer 12 inside the semiconductor wafer processing apparatus 30.

The wafer importer 32 puts the semiconductor wafer 12 in the semiconductor wafer processing apparatus 30 and takes out the semiconductor wafer 12 from the semiconductor wafer processing apparatus 30. The semiconductor wafer 12 imported into the wafer importer 32 is moved to the modified layer unformed region detection mechanism 34.

Figure 12:
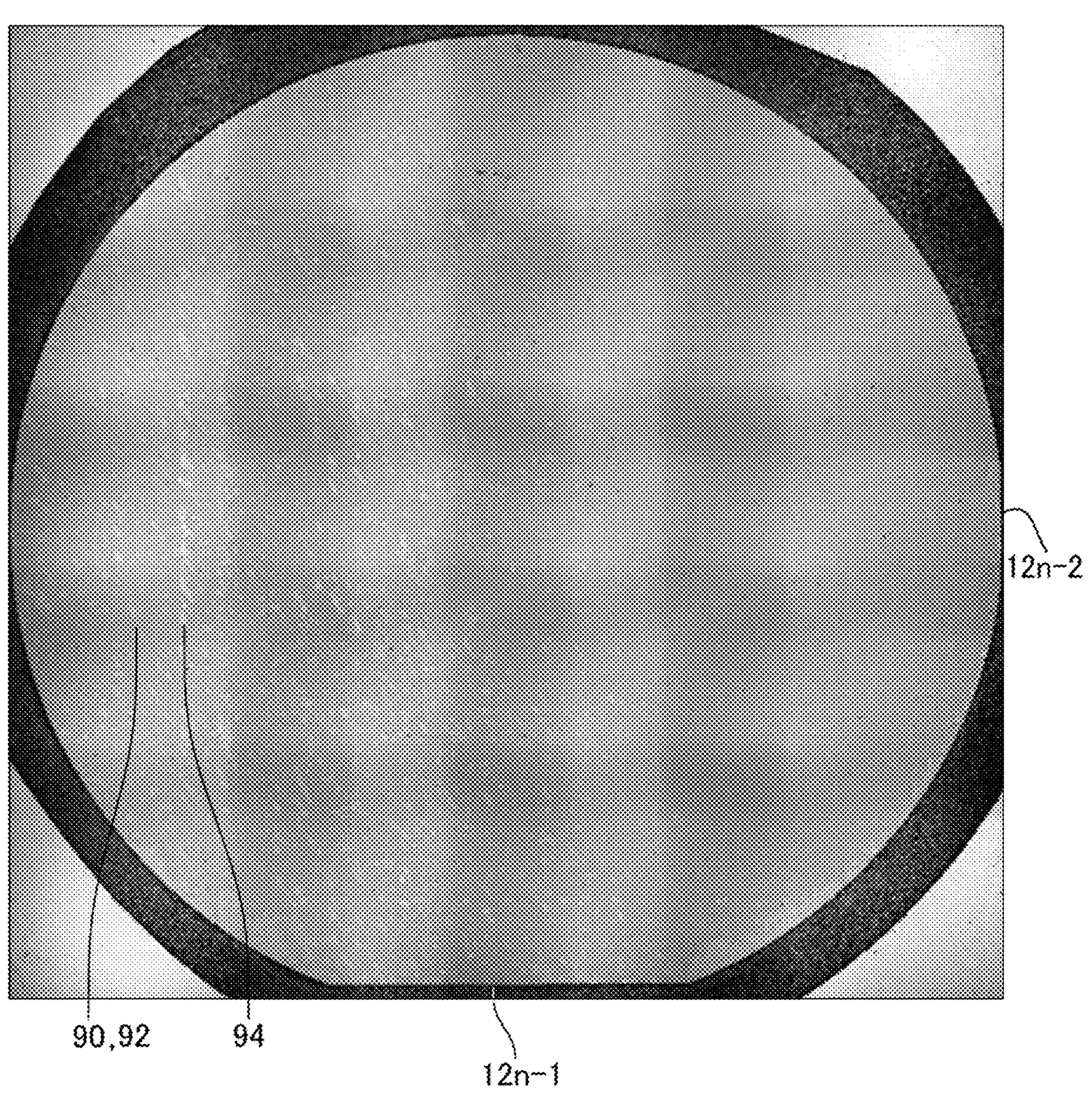
FIG. 12 illustrates an image of the semiconductor wafer captured by a modified layer unformed region detecting mechanism.
Figure 13:
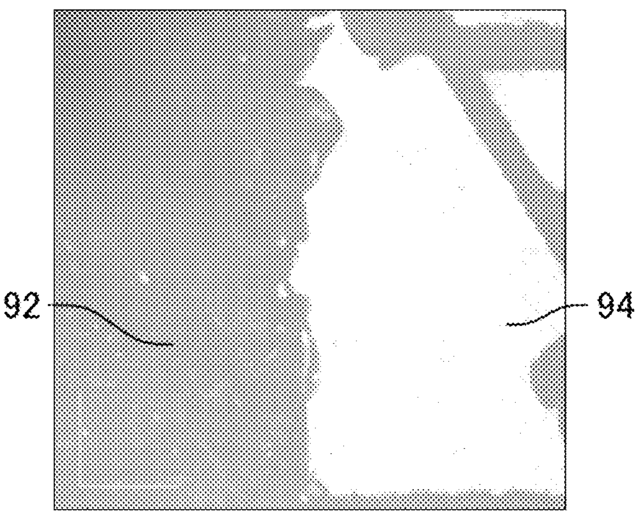
FIG. 13 illustrates an image of each of the modified layer formed region and the modified layer unformed region.
Figure 14:
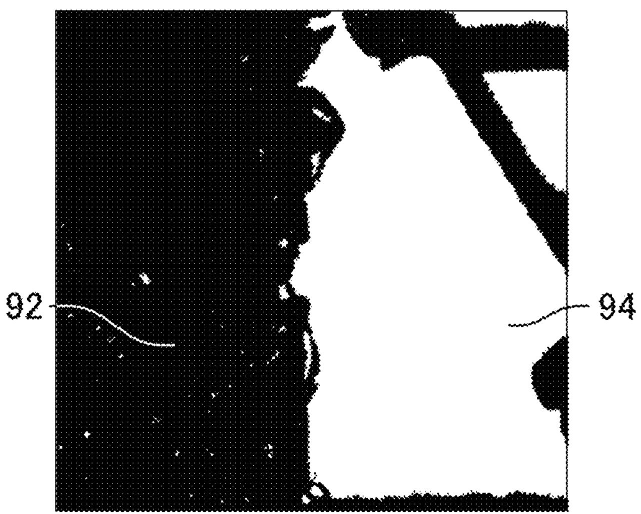
FIG. 14 illustrates an image acquired by binarizing the image in FIG. 13.
Figure 15:
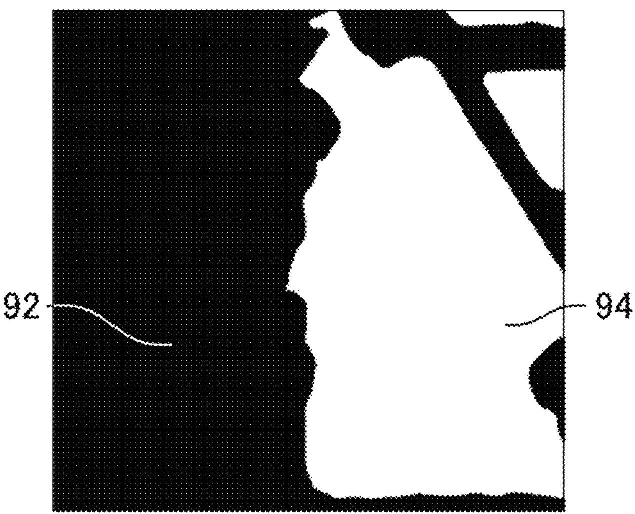
FIG. 15 illustrates an image acquired by executing noise removal processing on the image in FIG. 14.

The modified layer unformed region detection mechanism 34 executes the modified layer unformed region detecting process. The modified layer unformed region detection mechanism 34 includes a camera, and captures an image of the semiconductor wafer 12 from the upper surface 12*a*. FIG. 12 illustrates an image of the semiconductor wafer 12 captured by the modified layer unformed region detection mechanism 34. The semiconductor wafer 12 is transparent to light, and the modified layer 90 can be observed from the appearance of the semiconductor wafer 12. For example, in the image illustrated in FIG. 12, a gray region is the modified layer 90, in other words, the modified layer formed region 92; and a white region is the modified layer unformed region 94. The modified layer unformed region detection mechanism 34 identifies the modified layer formed region 92 and the modified layer unformed region 94 based on the captured image. Each of FIGS. 13 to 15 illustrates an enlarged image of the modified layer formed region 92 and the modified layer unformed region 94. FIG. 13 illustrates an image captured by the camera. In FIG. 13, a gray region is the modified layer formed region 92; and a white region is the modified layer unformed region 94. The modified layer unformed region detection mechanism 34 calculates an image by binarizing the luminance value of each pixel of the image captured by the camera using a value between white and gray. For example, the modified layer unformed region detection mechanism 34 calculates an image illustrated in FIG. 14 as a binarized image of the image illustrated in FIG. 13. Subsequently, the modified layer unformed region detection mechanism 34 executes noise removal processing for the binarized image. For example, the modified layer unformed region detection mechanism 34 executes the noise removal processing for the image illustrated in FIG. 14 to calculate an image illustrated in FIG. 15, in other words, an image in which a micro area of white and black is removed and a boundary line between the white region and black region is smoothened. The image acquired after the execution of the noise removal processing has a black region and a white region. The modified layer unformed region detection mechanism 34 identifies the black region as the modified layer formed region 92, and identifies the white region as the modified layer unformed region 94. The modified layer unformed region detection mechanism 34 calculates a coordinate range of the modified layer unformed region 94. The coordinate range of the modified layer unformed region 94 is a coordinate range expressed by an XY coordinate system. The modified layer unformed region detection mechanism 34 transmits the calculated coordinate range to the cut starting point determination device 42. When the modified layer unformed region detecting process is completed, the semiconductor wafer 12 is moved to the wafer angle adjustment mechanism 36.

Figure 16:
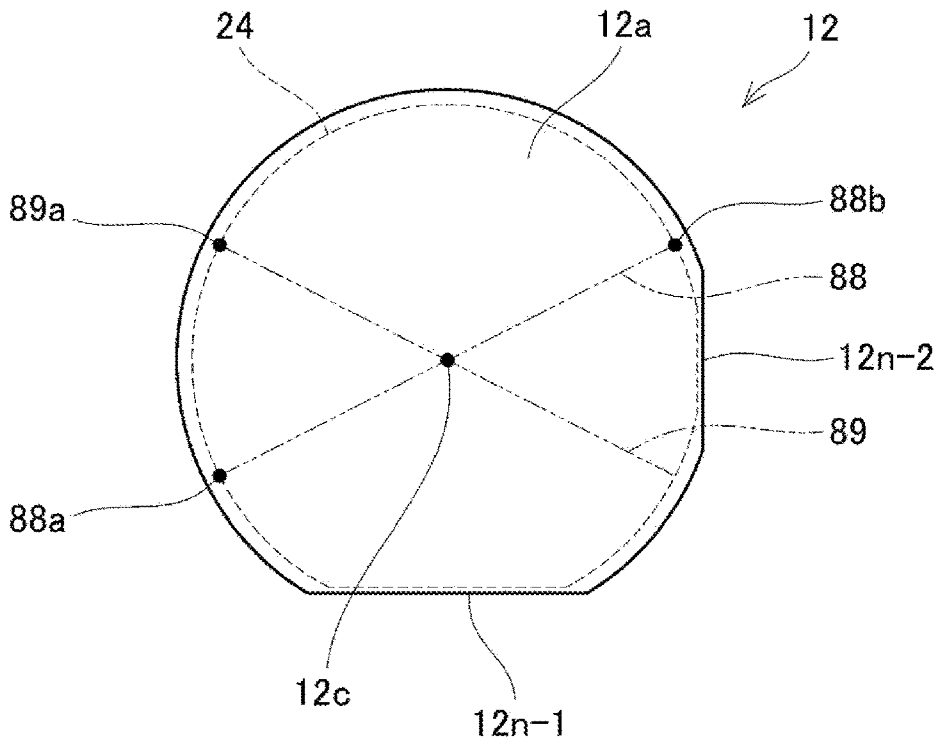
FIG. 16 illustrates a cut starting point determination process.

The cut starting point determination device 42 receives the coordinate range of the modified layer unformed region 94 to execute the cut starting point calculating process. In the cut starting point calculating process, the cut starting point determination device 42 initially detects orientation flats 12*n*-1, 12*n*-2 from the image, for example, the image illustrated in FIG. 12, captured by the modified layer unformed region detection mechanism 34. Subsequently, the cut starting point determination device 42 specifies a first separation line 88 illustrated in FIG. 16 with reference to the respective positions and angles of the orientation flats 12*n*-1, 12*n*-2. The first separation line 88 is a line passing through a center 12*c* of the outer circle of the semiconductor wafer 12 and extending in the specific crystal orientation at the upper surface 12*a*. The outer circle of the semiconductor wafer 12 is a portion of the outer shape, in other words, the contour of the semiconductor wafer 12 that has an arc shape. The specific crystal orientation is a predetermined crystal orientation, and is stored in the cut starting point determination device 42. As the specific crystal orientation, it is possible to adopt a crystal orientation in which the cutting plane is likely to be flat when the crack progresses in this crystal orientation. The cut starting point determination device 42 specifies the first separation line 88, and then specifies one of the end portions of the first separation line 88 as a first end portion 88*a* and specifies the other one of the end portions of the first separation line 88 as a second end portion 88*b*. Each of the first end portion 88*a* and the second end portion 88*b* is an intersecting point of the first separation line 88 and the peripheral portion 24. Subsequently, the cut starting point determination device 42 determines whether or not each of the first end portion 88*a* and the second end portion 88*b* is present at the modified layer unformed region 94 based on the coordinate range of the modified layer unformed region 94 calculated by the modified layer unformed region detection mechanism 34. The cut starting point determination device 42 determines the first end portion 88*a* as the cut starting point, based on a condition that the first end portion 88*a* is absent from the modified layer unformed region 94. The cut starting point determination device 42 determines the second end portion 88*b* as the cut starting point, based on a condition that the first end portion 88*a* is present at the modified layer unformed region 94 and the second end portion 88*b* is absent from the modified layer unformed region 94. The cut starting point determination device 42 specifies a second separation line 89 illustrated in FIG. 16 based on a condition that each of the first end portion 88*a* and the second end portion 88*b* is present at the modified layer unformed region 94, and determines one of the end portions (referred to as a third end portion 89*a* in the following) as the cutting start point. The second separation line 89 is different from the first separation line 88. The second separation line 89 is a line passing through the center 12*c* and extending in a crystal orientation different from the first separation line 88.

Figure 17:
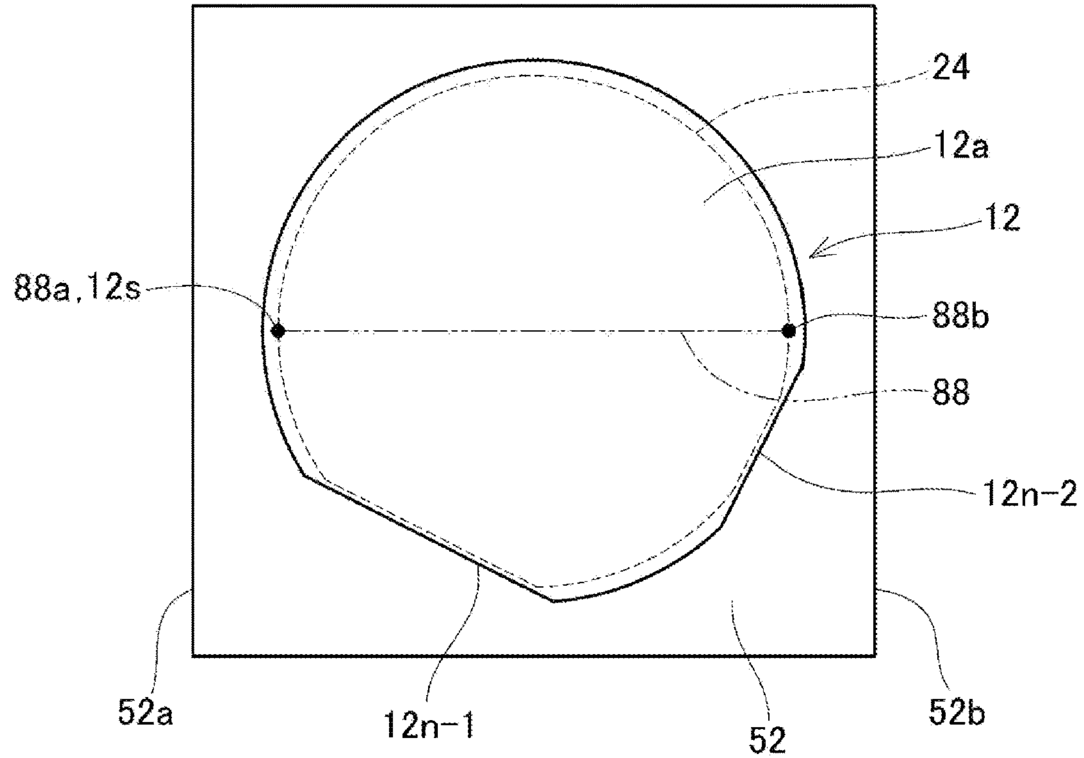
FIG. 17 is a plan view of arrangement of the semiconductor wafer on a stage in a case where a first end portion of the semiconductor wafer is a starting point of the cutting in a cutting process according to an embodiment.
Figure 18:
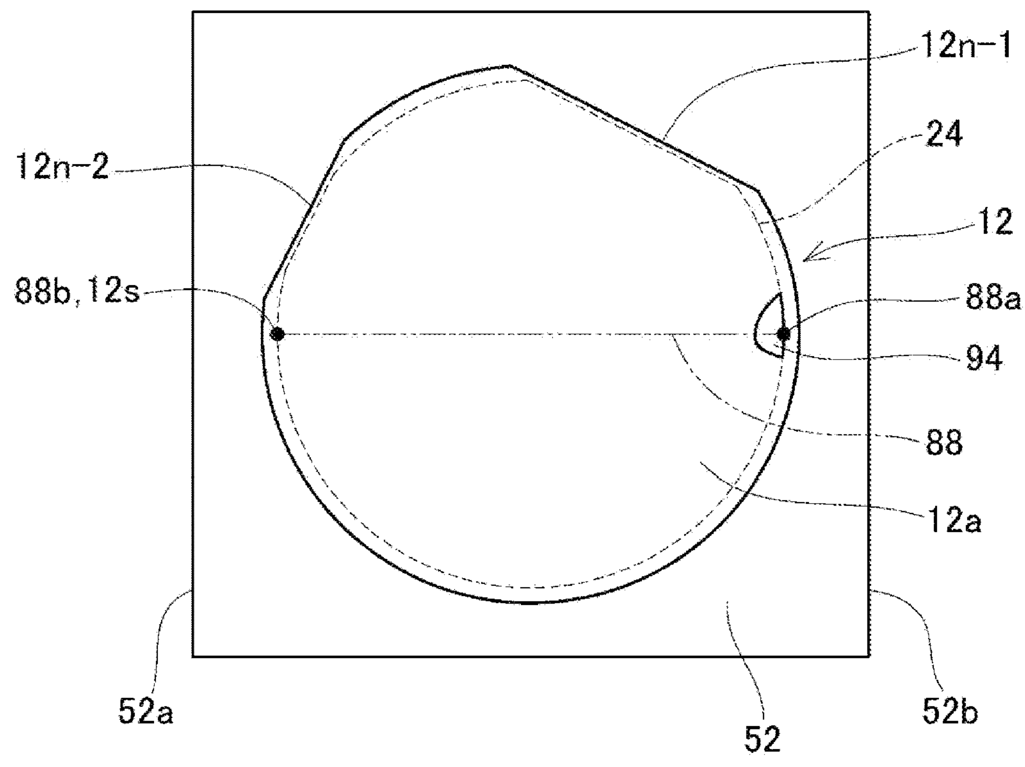
FIG. 18 is a plan view of the arrangement of the semiconductor wafer on a stage in a case where a second end portion of the semiconductor wafer is a starting point of the cutting in the cutting process according to the embodiment.
Figure 19:
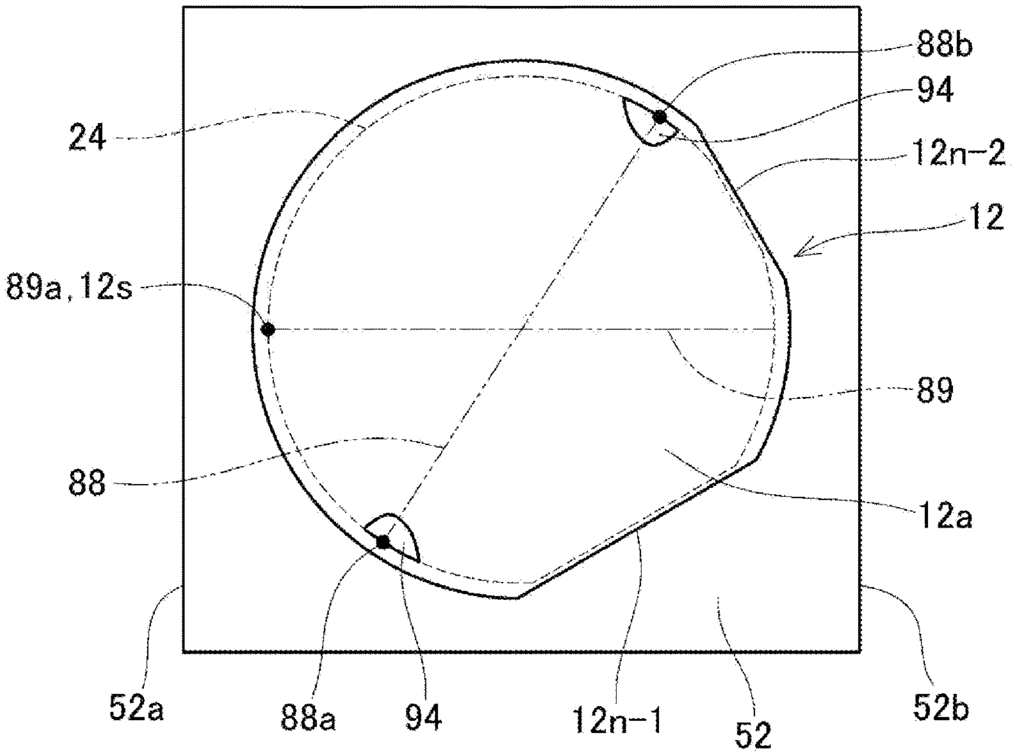
FIG. 19 is a plan view of the arrangement of the semiconductor wafer on a stage in a case where a third end of the semiconductor wafer is a starting point of the cutting in the cutting process according to the embodiment.

After the cut starting point determining process is completed, the angle adjusting process is executed. In the angle adjusting process, the angle of the semiconductor wafer 12 is adjusted by the wafer angle adjustment mechanism 36, and the semiconductor wafer 12 is subsequently moved onto the stage 52 of the cutting mechanism 50. The wafer angle adjustment mechanism 36 and the cutting mechanism 50 are controlled by the controller 40. The wafer angle adjustment mechanism 36 has a rotatable stage. In the angle adjusting process, the semiconductor wafer 12 is initially placed onto the stage of the wafer angle adjustment mechanism 36. Subsequently, the controller 40 controls the stage of the wafer angle adjustment mechanism 36 to rotate the semiconductor wafer 12 around the center 12*c*. Therefore, the angle of the semiconductor wafer 12 with respect to the cutting mechanism 50 is adjusted. The semiconductor wafer 12 after the angle adjustment is moved onto the stage 52 of the cutting mechanism 50. As illustrated in FIG. 17, in a case where the first end portion 88*a* is determined as the cut starting point, the angle of the semiconductor wafer 12 is adjusted on the stage of the cutting mechanism 50 such that the first end portion 88*a* becomes the cut starting point 12*s*. In other words, the angle of the semiconductor wafer 12 is adjusted such that the first end portion 88*a* is located closest to the side surface 52*a* in the peripheral portion 24. As illustrated in FIG. 18, in a case where the second end portion 88*b* is determined as the cut starting point (in other words, the first end portion 88*a* is present at the modified layer unformed region 94), the controller 40 adjusts the angle of the semiconductor wafer 12 on the stage of the cutting mechanism 50 such that the second end portion 88*b* reaches the cut starting point 12*s*. As illustrated in FIG. 19, in a case where the third end portion 89*a* is determined as the cut starting point (in other words, each of the first end portion 88*a* and the second end portion 88*b* is present at the modified layer unformed region 94), the controller 40 adjusts the angle of the semiconductor wafer 12 on the stage of the cutting mechanism 50 such that the third end portion 89*a* reaches the cut starting point 12*s*. In the angle adjusting process, the angle of the semiconductor wafer 12 is adjusted such that the modified layer unformed region 94 is not located at the cut starting point 12*s*.

After the angle adjusting process is completed, the controller 40 controls the cutting mechanism 50 to execute the semiconductor wafer cutting process. In the semiconductor wafer cutting process according to the present embodiment, the semiconductor wafer 12 is cut at the modified layer 90 with the cut starting point 12*s* as a starting point, as similar to the semiconductor wafer cutting process according to the comparative example. That is, the controller 40 drives a motor in the cutting mechanism 50 to rotate a rotary plate 54, in a situation where the lower surface 12*b* of the semiconductor wafer 12 is fixed to the stage 52 and the upper surface 12*a* of the semiconductor wafer 12 is fixed to the rotary plate 54. As a result, the semiconductor wafer 12 is cut as illustrated in FIG. 6.

Figure 10:
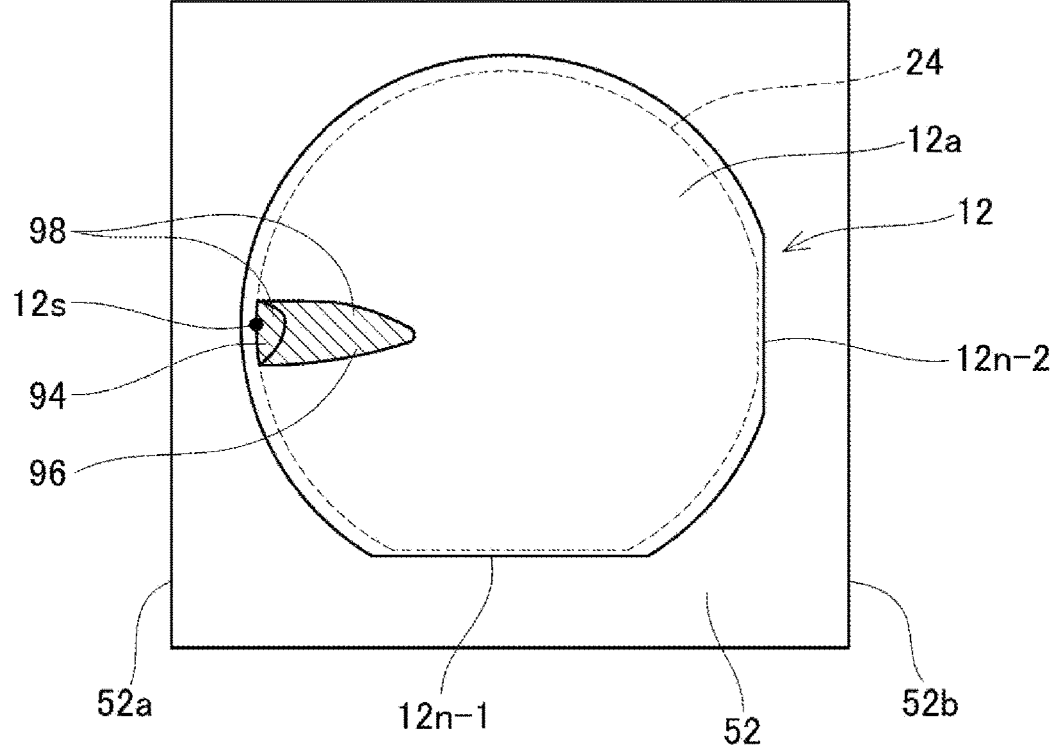
FIG. 10 is a plan view illustrating an example of distribution of an unintended cutting portion in the cutting process according to the comparative example.

In the manufacturing method according to the present embodiment, the semiconductor wafer 12 is placed on the stage 52 such that the modified layer unformed region 94 is not located at the cut starting point 12*s*. In the semiconductor wafer cutting process, as illustrated in FIG. 10, the unintended cutting portion 98 is prevented from being generated from the modified layer unformed region 94 located at the cut starting point 12*s* to the region 96 adjacent to the modified layer unformed region 94. For example, as illustrated in FIGS. 18, 19, in a case where the modified layer unformed region 94 exists at the position other than the cut starting point 12*s*, although an unintended cutting portion is generated in the modified layer unformed region 94, it is possible to inhibit the generation of unintended cutting at the modified layer formed region 92 adjacent to the modified layer unformed region 94.

By cutting the semiconductor wafer 12 into the upper portion 12U and the lower portion 12L, it is possible to acquire the upper portion 12U with a smaller thickness. By performing, for example, electrode formation, dicing for the upper portion 12U, it is possible to manufacture a semiconductor element with a smaller thickness. The lower portion 12L can be reused in manufacturing the semiconductor element.

In the above embodiment, the semiconductor wafer 12 is made of gallium nitride. However, the semiconductor wafer 12 may be made of a group III-V semiconductor or gallium oxide that is different from gallium nitride. Since these kinds of material have transparency, it is easier to identify the modified layer unformed region and the modified layer formed region from the appearance of the semiconductor wafer.

In the above embodiment, the controller 40 and the cut starting point determination device 42 are respectively constructed by different arithmetic circuits. However, the controller 40 and the cut starting point determination device 42 may also be commonly constructed by one arithmetic circuit.

In the above embodiment, the wafer angle adjustment mechanism 36 is provided separately from the cutting mechanism 50. However, the wafer angle adjustment mechanism 36 and the cutting mechanism 50 may be constructed in the same device. For example, the stage 52 of the cutting mechanism 50 may have a wafer angle adjustment function.

In the above embodiment, the cut starting point determination device 42 calculates the separation lines 88, 89, and determines the respective end portions of the separation lines 88, 89 as the cut starting points. However, any method may be adopted to determine the cut starting point as long as the modified layer unformed region is not located at the cut starting point.

In the above embodiment, the modified layer unformed region is detected based on the image captured by the camera. However, the modified layer unformed region may be detected by, for example, a transmissive laser sensor.

The wafer angle adjustment mechanism 36 described in the above embodiment and the transport mechanism for transporting the semiconductor wafer to the cutting mechanism 50 correspond to a position adjustment mechanism or a position adjuster.

Although the embodiments have been described in detail above, these are merely examples and do not limit the scope of present disclosure. The techniques described in the present disclosure include various modifications and modifications of the specific examples illustrated above. The technical elements described in the present disclosure or the drawings exhibit technical usefulness alone or in various combinations, and are not limited to the combinations described in the present disclosure at the time of filing. In addition, the techniques illustrated in the present specification or drawings achieve multiple objectives at the same time, and achieving one of the objectives itself has technical usefulness.

What is claimed is:

1. A method of manufacturing a semiconductor element, the method comprising:

forming a modified layer extending along a surface of a semiconductor wafer inside the semiconductor wafer by irradiating a laser on the semiconductor wafer, the surface of the semiconductor wafer including a peripheral portion having a first region and a second region, the first region being a region in which the modified layer is not formed, the second region being different from the first region and being a region in which the modified layer is formed;

detecting the first region;

specifying a separation line at the surface of the semiconductor wafer, the separation line extending in a specific crystal orientation of the semiconductor wafer while passing through a center of an outer circle of the semiconductor wafer;

adjusting an angle of the semiconductor wafer with respect to a cutter by rotating the semiconductor wafer such that the second region is located at a cut starting point of the cutter; and cutting the semiconductor wafer at the modified layer starting from the second region by using the cutter, after the adjusting of the angle and after the specifying of the separation line, wherein the separation line has a first end portion and a second end portion on a side opposite from the first end portion, the cutting of the semiconductor wafer further includes determining whether the first end portion of the separation line is present at the first region, in the cutting of the semiconductor wafer, the semiconductor wafer is cut at the modified layer starting from the first end portion based on a condition that the first end portion is absent from the first region, and in the cutting of the semiconductor wafer, the semiconductor wafer is cut at the modified layer starting from the second end portion based on a condition that the first end portion is present at the first region.

2. The method according to claim 1, wherein the semiconductor wafer is made of a group III-V semiconductor or gallium oxide.

3. The method according to claim 1, wherein, in the cutting of the semiconductor wafer, the semiconductor wafer is cut at the modified layer starting from an end portion of a line located on the surface of the semiconductor wafer, based on a condition that both of the first end portion and the second end portion are present at the first region, and wherein the line extends in a direction different from the specific crystal orientation while passing through the center of the outer circle of the semiconductor wafer.

4. The method according to claim 1, wherein in the detecting of the first region, the first region and the second region are specified based on an image taken by a camera.

5. The method according to claim 1, further comprising:

locating the semiconductor wafer at the cutter, wherein in the locating of the semiconductor wafer at the cutter, the angle of the semiconductor wafer is adjusted to locate the second region at a cut starting point of the cutter, and in the cutting of the semiconductor wafer, the semiconductor wafer is cut by the cutter at the modified layer from the cut starting point.

6. The method according to claim 1, wherein in a case where the first region and the second region are present at the peripheral portion, the semiconductor wafer is cut by the cutter at the modified layer.

7. The method according to claim 1, wherein rotating the semiconductor wafer is performed by placing the semiconductor wafer on a rotatable stage and rotating the semiconductor wafer around a center of the semiconductor wafer.

8. The method according to claim 1, wherein the detecting of the first region includes calculating a coordinate range of the first region, and the cutting of the semiconductor wafer further includes determining, based on the calculated coordinate range, whether the first end portion of the separation line is present at the first region, in the cutting of the semiconductor wafer, the semiconductor wafer is cut at the modified layer starting from the first end portion, based on determining, according to the calculated coordinate range, that the first end portion is absent from the first region, and in the cutting of the semiconductor wafer, the semiconductor wafer is cut at the modified layer starting from the second end portion, based on determining, according to the calculated coordinate range, that the first end portion is present at the first region.

9. The method according to claim 8, wherein the cutting of the semiconductor wafer further includes determining, based on the calculated coordinate range, whether the second end portion of the separation line is present at the first region, in the cutting of the semiconductor wafer, the semiconductor wafer is cut at the modified layer starting from an end portion of a line located on the surface of the semiconductor wafer, based on determining, according to the calculated coordinate range, that both of the first end portion and the second end portion are present at the first region, and the line extends in a direction different from the specific crystal orientation while passing through the center of the outer circle of the semiconductor wafer.

10. A semiconductor wafer processing apparatus for processing a semiconductor wafer, comprising:

a detector;

a position adjuster; and a cutter, wherein the semiconductor wafer includes a modified layer extending along a surface of the semiconductor wafer inside the semiconductor wafer, wherein the surface of the semiconductor wafer includes a peripheral portion having a first region and a second region, the first region being a region in which the modified layer is absent, the second region being different from the first region and being a region in which the modified layer is present, wherein the detector is configured to detect the first region, wherein the position adjuster comprises a rotatable stage and is configured to adjust an angle of the semiconductor wafer with respect to the cutter and to dispose the semiconductor wafer at the cutter while locating the second region at a cut starting point of the cutter after adjusting the angle of the semiconductor wafer, wherein the cutter is configured to cut the semiconductor wafer at the modified layer starting from the cut starting point, and wherein the position adjuster is further configured to:

specify a separation line on the surface of the semiconductor wafer, the separation line extending in a specific crystal orientation of the semiconductor wafer while passing through a center of an outer circle of the semiconductor wafer, the separation line having a first end portion and a second end portion on a side opposite from the first end portion;

determine whether the first end portion of the separation line is present at the first region prior to the cutting of the semiconductor wafer;

dispose the semiconductor wafer at the cutter while locating the first end portion at the cut starting point, based on a condition that the first end portion is absent from the first region; and dispose the semiconductor wafer at the cutter while locating the second end portion at the cut starting point, based on a condition that the first end portion is present at the first region.

11. The semiconductor wafer processing apparatus according to claim 10, wherein the position adjuster is further configured to dispose the semiconductor wafer at the cutter while locating an end portion of a line at the cut starting point, based on a condition that both of the first end portion and the second end portion of the separation line are present at the first region, and wherein the line is located on the surface of the semiconductor wafer, and the line extends in a direction different from the specific crystal orientation while passing through the center of the outer circle of the semiconductor wafer.

12. The semiconductor wafer processing apparatus according to claim 10, wherein the detector includes a camera, and the detector is configured to specify the first region and the second region based on an image taken by the camera.

13. The semiconductor wafer processing apparatus according to claim 10, wherein the cutter comprises a bottom stage;

a rotary plate; and a rotary shaft around which the rotary plate is configured to rotate, wherein the bottom stage is configured to be attached to a first outer surface of the semiconductor wafer, the rotary plate is configured to be attached to a second outer surface of the semiconductor wafer that is opposite the first outer surface of the semiconductor wafer, and the cutter is configured to cut the semiconductor wafer by rotating the rotary plate around the rotary shaft.

* * * * *